(12) United States Patent
Lee et al.

(10) Patent No.: US 9,300,112 B2
(45) Date of Patent: Mar. 29, 2016

(54) PACKAGED LASER DIODE AND METHOD OF PACKAGING A LASER DIODE

(71) Applicant: JDS Uniphase Corporation, Milpitas, CA (US)

(72) Inventors: Kong Weng Lee, San Jose, CA (US); Vincent V. Wong, Los Altos, CA (US)

(73) Assignee: Lumentum Operations LLC, Milpitas, CA (US)

( * ) Notice: Subject to any disclaimer, the term of this patent is extended or adjusted under 35 U.S.C. 154(b) by 440 days.

(21) Appl. No.: 14/133,360

(22) Filed: Dec. 18, 2013

(65) Prior Publication Data

US 2015/0255949 A1 Sep. 10, 2015

(51) Int. Cl.
| | |
|---|---|
| *H01S 3/04* | (2006.01) |
| *H01S 5/024* | (2006.01) |
| *H01S 5/00* | (2006.01) |
| *H01S 5/022* | (2006.01) |
| *H01S 5/026* | (2006.01) |

(52) U.S. Cl.
CPC .............. *H01S 5/02469* (2013.01); *H01S 3/04* (2013.01); *H01S 3/0405* (2013.01); *H01S 5/0071* (2013.01); *H01S 5/024* (2013.01); *H01S 5/026* (2013.01); *H01S 5/0228* (2013.01); *H01S 5/0261* (2013.01); *H01S 5/02244* (2013.01); *H01S 5/02272* (2013.01); *H01S 5/02276* (2013.01); *H01S 5/02407* (2013.01); *H01S 5/0262* (2013.01)

(58) Field of Classification Search
CPC . H01S 5/02469; H01S 5/02407; H01S 5/024; H01S 5/026; H01S 5/0261; H01S 5/0262; H01S 3/0405; H01S 3/04
USPC .................. 372/34, 36, 43.01, 50.1
See application file for complete search history.

(56) References Cited

U.S. PATENT DOCUMENTS

| | | | |
|---|---|---|---|
| 4,752,109 A | 6/1988 | Gordon et al. ................... 385/14 |
| 5,557,116 A | 9/1996 | Masui et al. .................... 257/100 |
| 5,851,849 A | 12/1998 | Comizzoli et al. .............. 438/38 |
| 5,945,688 A | 8/1999 | Kasahara et al. ............... 257/81 |
| 6,521,989 B2 | 2/2003 | Zhou ............................. 257/698 |
| 6,784,511 B1 | 8/2004 | Kunihara et al. ............. 257/433 |
| 7,075,178 B2 * | 7/2006 | Yamamoto .................... 257/687 |
| 8,686,445 B1 * | 4/2014 | Hussell et al. ................. 257/88 |
| 2004/0066816 A1 * | 4/2004 | Collins et al. .................. 372/44 |
| 2005/0201666 A1 | 9/2005 | Terada et al. ................... 385/14 |
| 2010/0020839 A1 * | 1/2010 | Fujino et al. ................. 372/50.1 |
| 2012/0326178 A1 | 12/2012 | Fehrer et al. ................... 257/88 |

FOREIGN PATENT DOCUMENTS

| | | |
|---|---|---|
| DE | 102012102305 | 9/2013 |
| WO | 9850810 | 11/1998 |

* cited by examiner

*Primary Examiner* — Kinam Park
(74) *Attorney, Agent, or Firm* — Harrity & Harrity, LLP

(57) ABSTRACT

A leadframe-type packaged laser diode is provided, in which the laser diode chip is electrically decoupled from the package. A leadframe-type package including a two-dimensional grid of electrodes encapsulated in a molded plastic framework allows batch processing of one- or two-dimensional arrays of leadframes, the batch processing including laser diode chips attachment, wirebonding, and packaging, with subsequent breakout of individual packaged laser diodes from the one- or two-dimensional array.

20 Claims, 12 Drawing Sheets

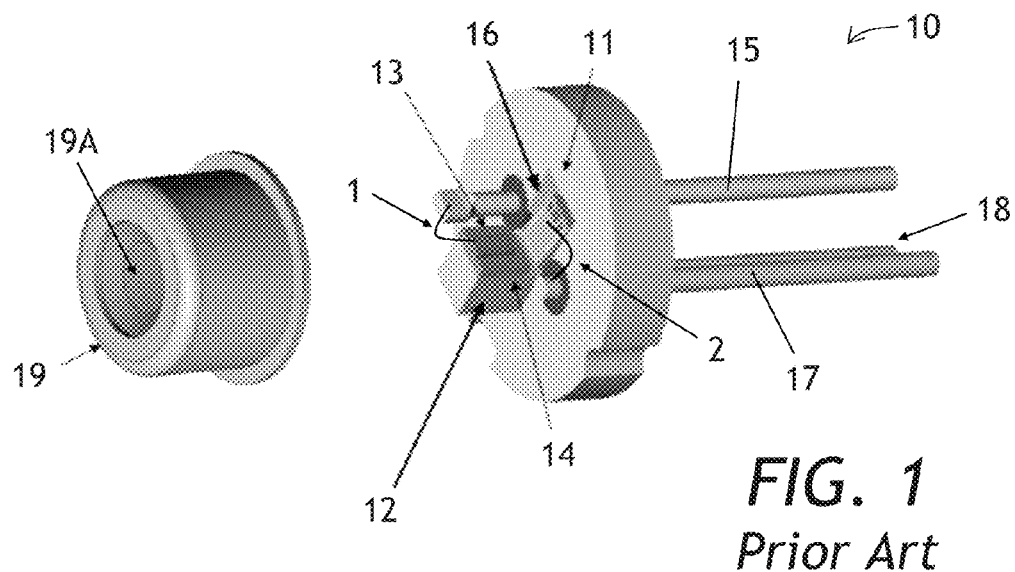
FIG. 1
Prior Art
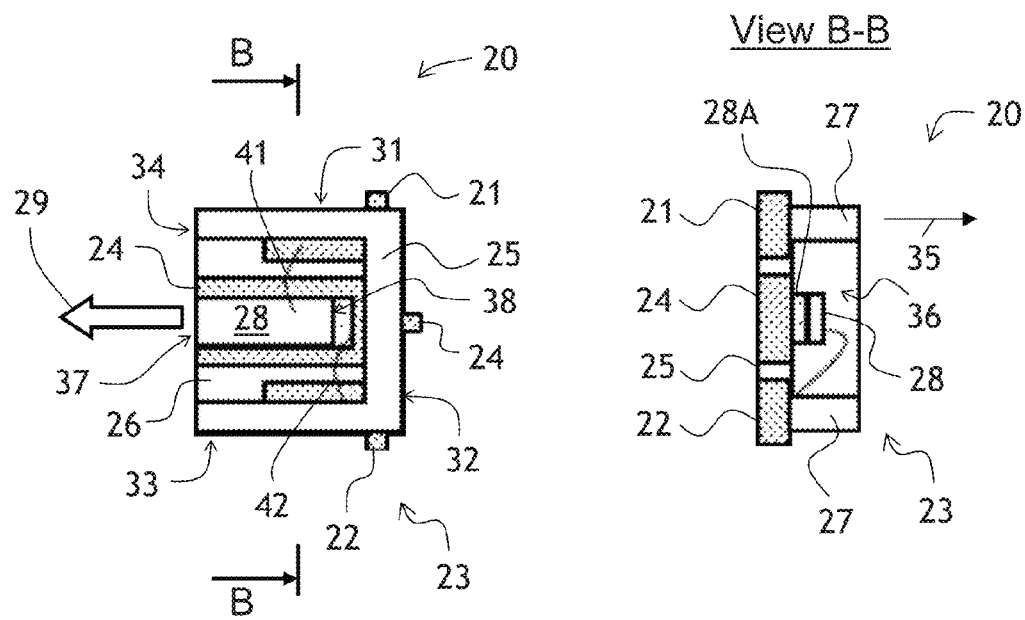
FIG. 2A
FIG. 2B

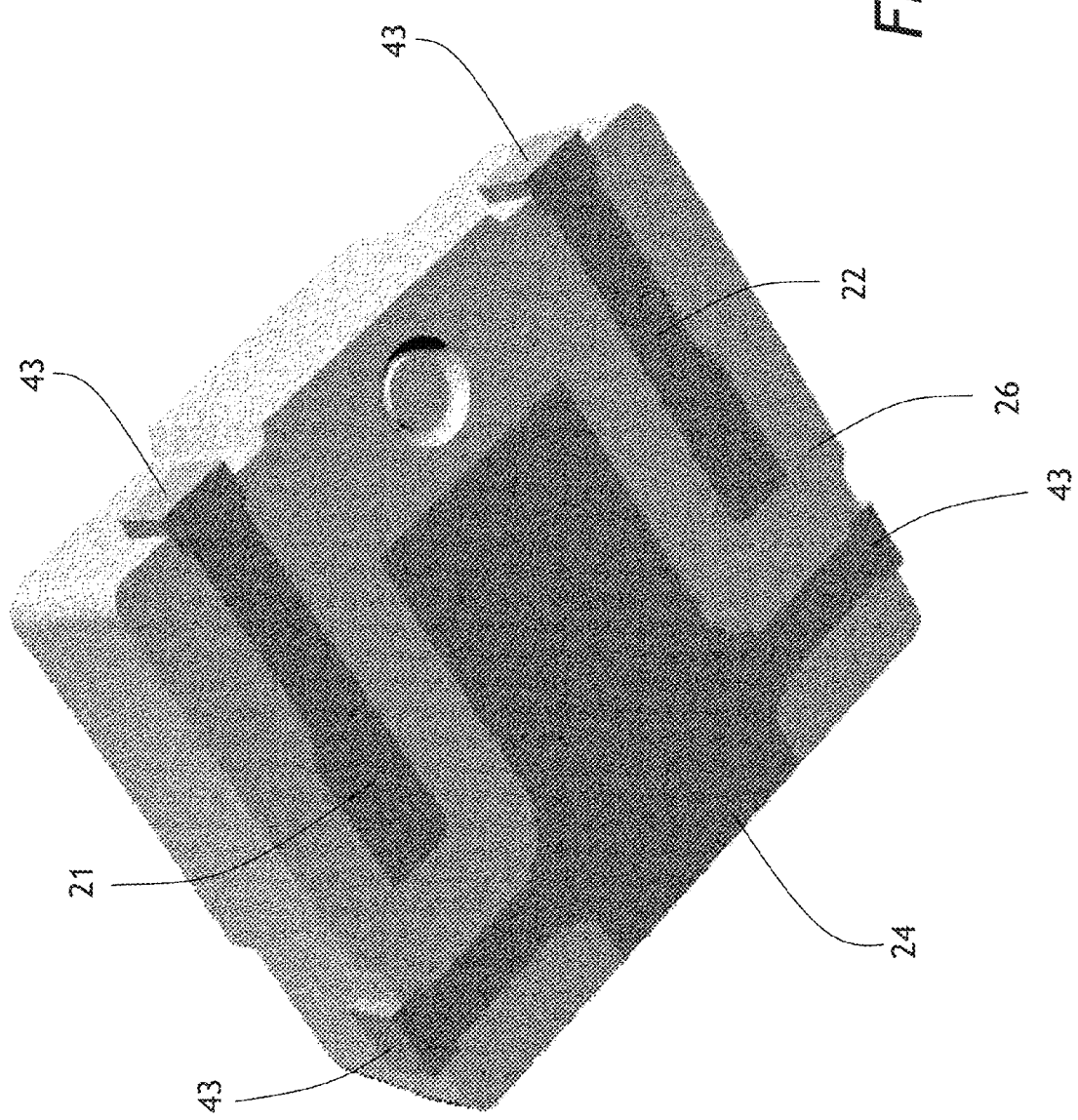

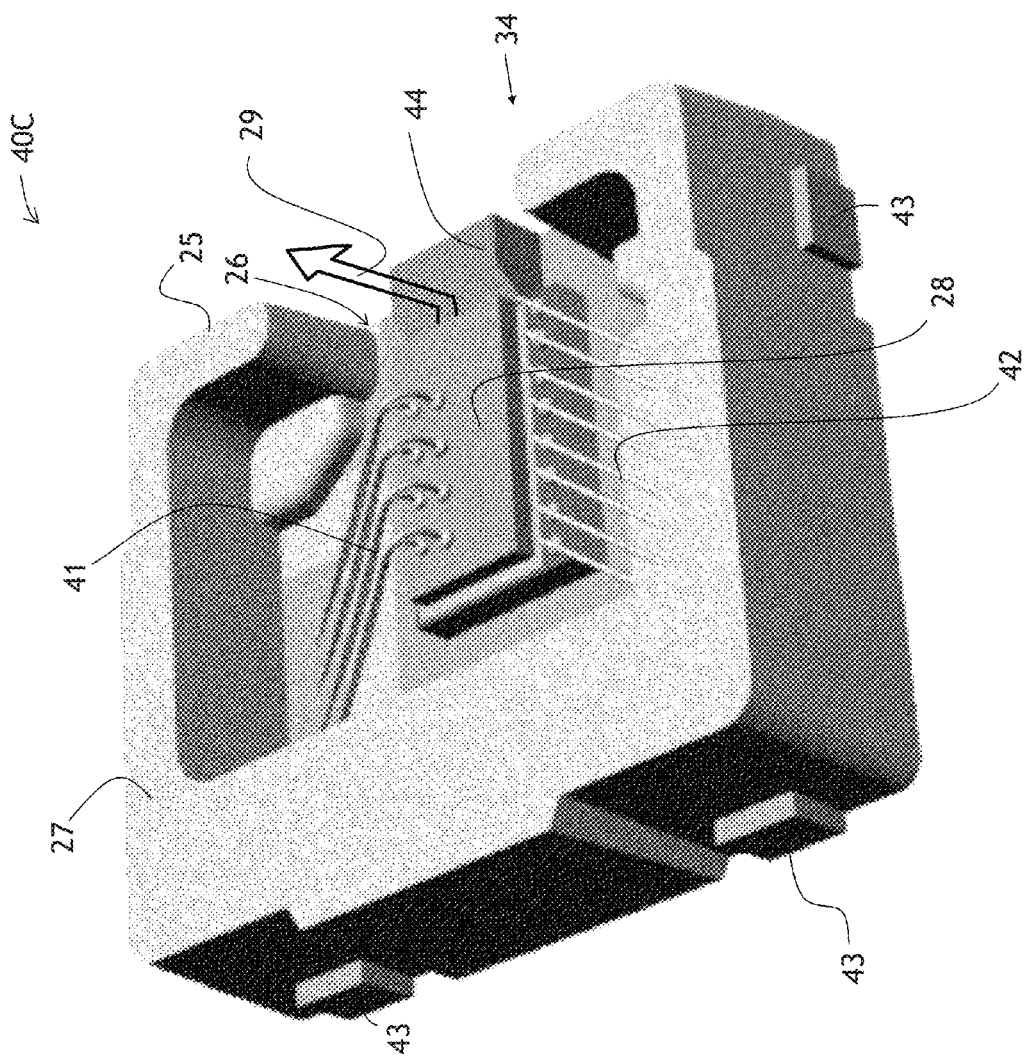

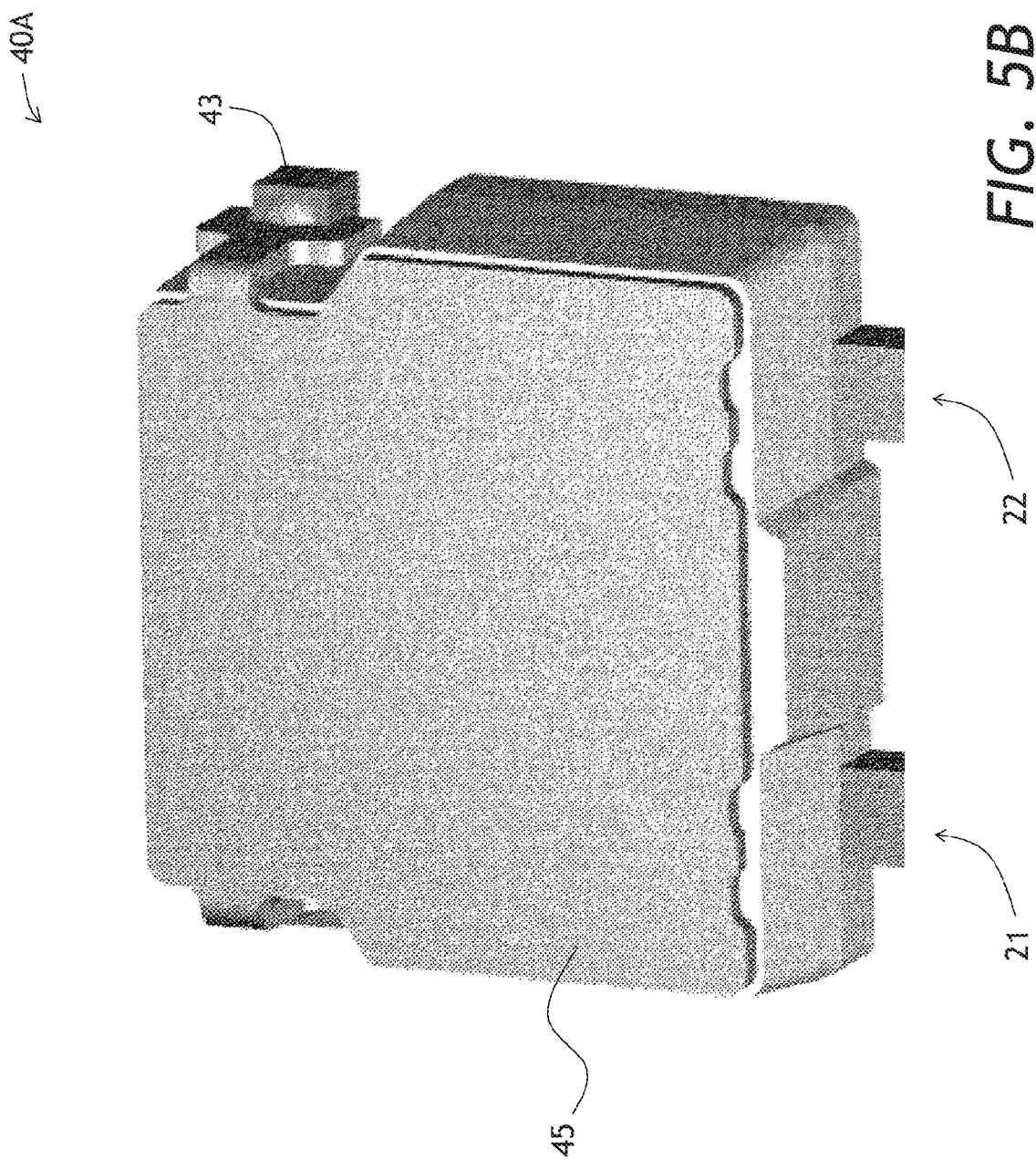

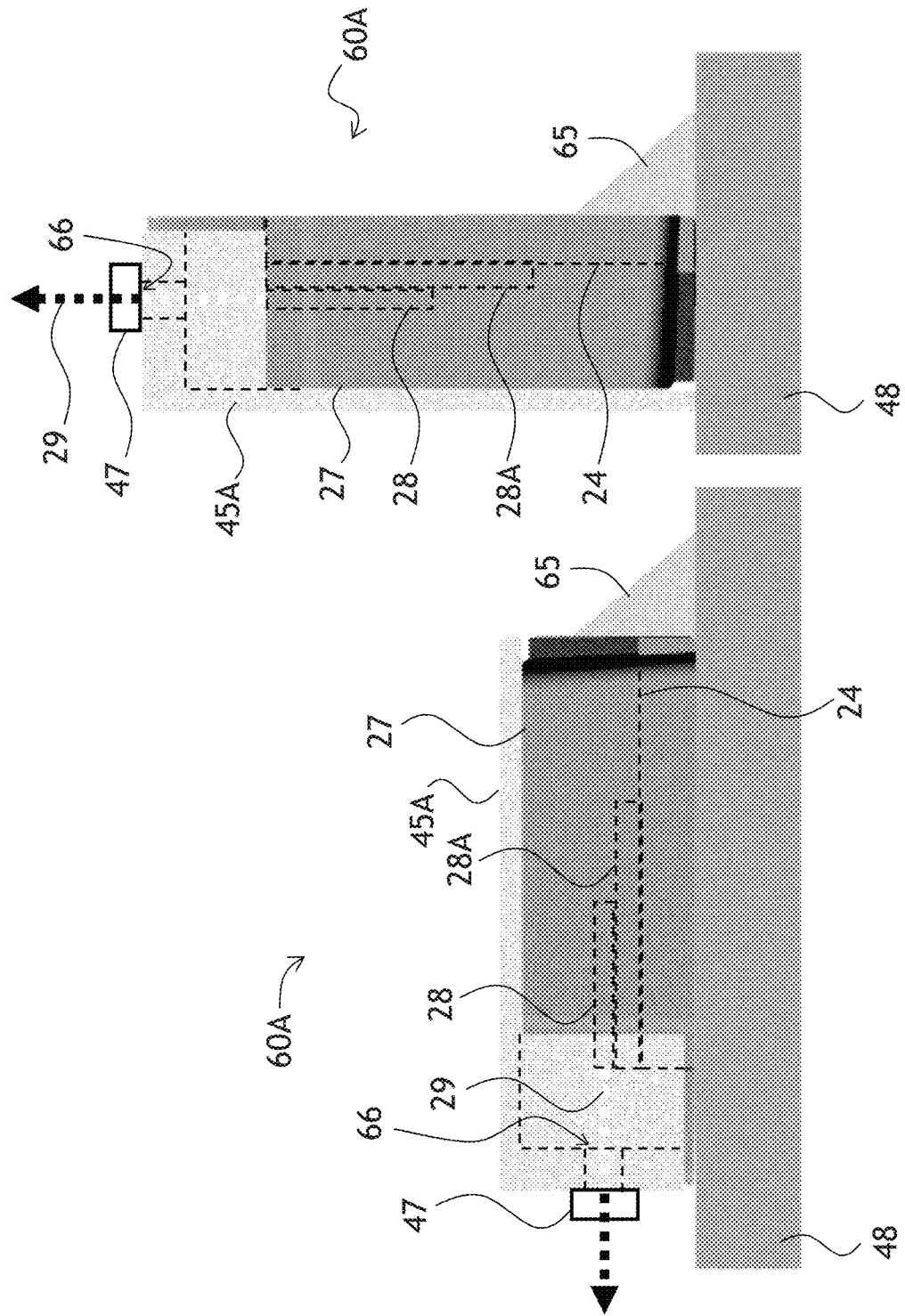

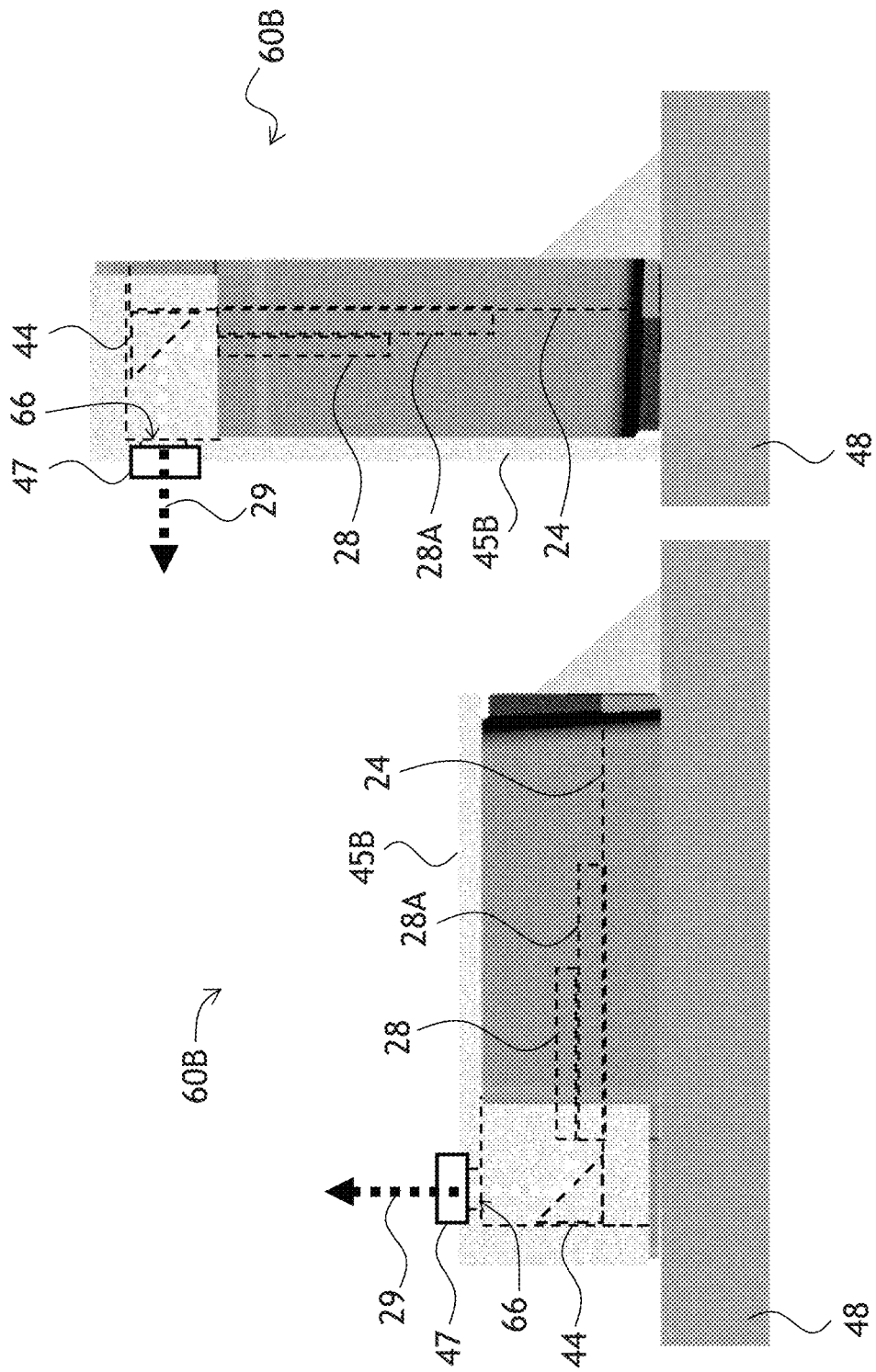

PACKAGED LASER DIODE AND METHOD OF PACKAGING A LASER DIODE

TECHNICAL FIELD

The present invention relates to electro-optical devices, and in particular to packaged laser diodes and methods of packaging laser diodes.

BACKGROUND OF THE INVENTION

A laser diode is a semiconductor diode, the p-n junction of which functions as a laser gain medium. To obtain population inversion in the gain medium, a forward current is applied to the p-n junction. Cleaved or polished facets of the laser diode chip can be used to form the laser cavity. An external mirror or a Bragg reflector can also be used for this purpose.

Laser diode chips need to be protected from dust, humidity, electrostatic discharge (ESD), and mechanical damage. Reliable electrical contacts need to be established to apply the electric current to the p-n junction, and heat generated in the p-n junction upon application of the current needs to be removed to prevent laser diode chips from overheating. To that end, laser diode chips are usually placed in metal enclosures equipped with heat sinks, electrical contacts, and windows for outputting the laser light.

It works best to include laser diode chips into individual hermetically sealable enclosures, although this latter requirement may be alleviated to some degree by applying a protective coating to laser diode chips. By way of example, Kunihara et al. in U.S. Pat. No. 6,784,511 disclose a laser diode chip encapsulated in a transparent silicone resin. Detrimentally, transparent epoxy layer effectively limits maximum amount of optical power emitted by the encapsulated laser diode chip, so the method of Kunihara et al. is only applicable to relatively low-power laser diodes. Furthermore, epoxy or silicone resin coating does not provide an adequate electromagnetic interference (EMI) protection of the laser diode chip.

A more common prior-art can-type package, which also works for laser diodes having output optical power of several hundred milliwatt, is shown in FIG. 1. A packaged laser diode 10 includes a steel header 11, on which a copper heat sink 12 is soldered. A laser diode chip 13 is soldered to a submount 14, which is then attached to the heat sink 12. A first wirebond 1 connects the top side of the laser diode chip 13 to a laser electrode 15. The bottom side of the laser diode chip 13 is electrically coupled to the header 11. A monitoring photodiode 16 is placed in the package 10 to measure optical power of light emitted by the laser diode chip 13. One terminal of the monitoring photodiode 16 is connected to a photodiode electrode 17 via a second wirebond 2. The other terminal of the monitoring photodiode 16 is electrically coupled directly to the header 11. A middle electrode 18 provides an outside electrical connection to the header 11, thus closing the electrical circuit for both the laser diode chip 13 and the photodiode 16. A hermetic cap 19 having therein a window 19A is soldered or welded to the header 11.

The packaged laser diode 10 has several drawbacks. One, perhaps unexpected, drawback is electromagnetic sensitivity. Even though the laser diode 13 is shielded by the cap 19 from outside electromagnetic fields, the direct coupling of the laser diode 13 to the header 11 can cause EMI problems, especially when the laser diode 13 is driven by pulsed current, because both the cap 19 and the header 11 can radiate electromagnetic energy when subjected to the pulsed current. Another drawback is that, due to the geometry of the packaged laser diode 10, each laser diode chip 13 has to be packaged individually. The individual packaging of the laser diode chips 13 increases manufacturing costs. Yet another drawback is a relatively large size of the packaged laser diode 10.

SUMMARY OF THE INVENTION

It is a goal of the invention to provide a compact, manufacturable packaged laser diode having improved EMI protection characteristics.

In accordance with the invention, the EMI protection is improved by electrically decoupling the laser diode chip from the package. A leadframe-type package including one- or a two-dimensional grid of electrodes encapsulated in a molded plastic framework is provided to support, connect, and shield the laser diode chip. The leadframe-type packaging allows batch processing of one- or two-dimensional arrays of leadframes, including laser diode chips attachment, wirebonding, and packaging, with subsequent breakout of individual packaged laser diodes from the one- or two-dimensional array. The overall size of the packaged laser diode is considerably reduced, as compared with prior-art can-type packages. Furthermore, leadframe-type packages are more compatible with surface mount techniques of populating printed circuit boards. Preferably, dielectric coatings are applied to the laser diode chip facets, thus protecting the laser diode chips from humidity.

In accordance with the invention, there is provided a packaged laser diode comprising:

a leadframe comprising a thermally and electrically conductive floor plate, first and second electrodes, and a plastic framework supporting therein the floor plate, the first electrode, and the second electrode, wherein the plastic framework electrically insulates the floor plate, the first electrode, and the second electrode from each other;

the plastic framework including a bottom portion having therein or thereon the floor plate, the bottom portion having first to fourth perimeter sides and a sidewall extending from the bottom portion on at least the first to third perimeter sides in a direction substantially perpendicular to the floor plate, thereby defining a protective compartment space with the floor plate at the bottom;

a laser diode chip mounted on the floor plate and at least partially disposed within the protective compartment space, the laser diode chip having front and rear facets, the front facet facing the fourth perimeter side for outputting a laser beam generated by the laser diode chip, wherein in operation, the floor plate supports and conducts away heat generated by the laser diode chip; and first and second wirebonds connecting the first and second electrodes, respectively, to the laser diode chip, for supplying electric current thereto for generating the laser beam, wherein the first and second wirebonds are disposed within the protective compartment space.

In accordance with the invention, there is further provided a method for packaging a laser diode, the method comprising:

(a) providing a leadframe comprising a thermally and electrically conductive floor plate, first and second electrodes, and a plastic framework having therein the floor plate, the first electrode, and the second electrode;

the plastic framework including a bottom portion having therein or thereon the floor plate, the bottom portion having first to fourth perimeter sides and a sidewall extending from the bottom portion on at least the first to third perimeter sides in a direction substantially perpendicular to the floor plate, thereby defining a protective compartment space with the floor plate at the bottom;

(b) upon completing step (a), mounting a laser diode chip on the floor plate so that the laser diode chip is at least partially disposed within the protective compartment space, the laser diode chip having front and rear facets, the front facet facing the fourth perimeter side for outputting a laser beam generated by the laser diode chip; and (c) upon completing step (b), wirebonding the laser diode chip by connecting the first and second electrodes to the laser diode chip with first and second wirebonds, respectively, for supplying electric current thereto for generating the laser beam, wherein the first and second wirebonds are disposed within the protective compartment space.

BRIEF DESCRIPTION OF THE DRAWINGS

Exemplary embodiments will now be described in conjunction with the drawings, in which:

FIG. 1 is an exploded three-dimensional view of a prior-art packaged laser diode;

FIG. 2A is a plan view of a packaged laser diode according to the invention;

FIG. 2B is a side cross-sectional view taken along lines B-B in FIG. 2A;

FIG. 4B is a three-dimensional bottom view of the packaged laser diode of FIG. 4A;

FIG. 4C is a three-dimensional view of an embodiment of a packaged laser diode of the invention suitable for surface mounting to a printed circuit board, having a beam-turning mirror;

FIG. 5B is a three-dimensional top view of the packaged laser diode of FIG. 4A, showing the cover;

FIGS. 6A and 6B are side views of covered surface-mounted packaged laser diodes of FIGS. 4A and 4B, respectively, in a horizontal configuration;

FIGS. 7A and 7B are side views of covered surface-mounted packaged laser diodes of FIGS. 4A and 4B, respectively, in a vertical configuration;

DETAILED DESCRIPTION OF THE INVENTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 2C:
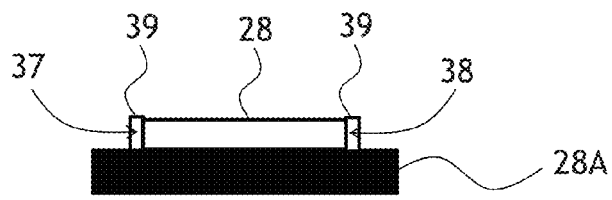
FIG. 2C is a magnified cross-sectional view of a mounted laser diode chip of the packaged laser diode of FIG. 2A.

Referring to FIGS. 2A to 2C, a packaged laser diode 20 includes a leadframe 23 having a thermally and electrically conductive floor plate 24, first 21 and second 22 electrodes, and a plastic framework 25 supporting the floor plate 24, the first electrode 21, and the second electrode 22. The plastic framework 25 electrically insulates the floor plate 24, the first electrode 21, and the second electrode 22 from each other. The plastic framework 25 has a bottom portion 26, which includes the floor plate 24. The floor plate 24 can be disposed on the bottom portion 26, or the floor plate 24 can be at least partially immersed into the bottom portion 26. In a preferred embodiment, the plastic framework 25 is molded of a liquid crystal polymer (LCP), shaped to partially encapsulate and hold together the floor plate 24 and first 21 and second 22 electrodes. The floor plate 24 should be made out of a thermally conductive material, e.g. it can be made of a gold-plated copper alloy. The purpose of the floor plate 24 is to support and conduct heat generated by the laser diode chip during normal operation away from the laser diode chip 28. Another purpose of the floor plate 24 is to provide EMI shielding, as will be explained below.

The bottom portion 26 has first 31, second 32, third 33, and fourth 34 perimeter sides and a sidewall 27 extending from the bottom portion 26 on at least the first 31 to third 33 perimeter sides in a direction 35 substantially perpendicular to the floor plate 24, defining a protective compartment space 36 with the floor plate 24 at the bottom. A laser diode chip 28 is mounted on an optional submount 28A mounted on the floor plate 24 within the protective compartment space 36. The laser diode chip 28 is at least partially disposed within the protective compartment space 36. The laser diode chip 28 can also be completely disposed within the protective compartment space 36.

The laser diode chip 28 has electrical contacts (not shown) on both top and bottom surfaces, so that the bottom surface of the laser diode chip 28 needs to be isolated from the floor plate 24, enabling the floor plate to be electrically grounded for EMI shielding purposes. To that end, in one embodiment, the submount 28A is made of an electrically non-conductive material coated with a metal layer on top, while lacking metal coating on the sides, so that the laser diode chip 28 can be soldered to the top metal layer while being electrically isolated from the floor plate 24. By way of a non-limiting example, the submount 28A can be made of gold-coated aluminum nitride (AlN) or another suitable material having good thermal conductivity and a thermal expansion coefficient (CTE) close enough to the CTE of the laser diode chip 28 (e.g. CTE of silicon, for silicon laser diode chips 28), to reduce thermally induced mechanical stresses. The laser diode chip 28 can be soldered to the gold coating of the submount 28A using AuSn solder.

The submount 28A can be soldered to the floor plate 24, or it can be epoxied to the floor plate 24 using a thermally conductive epoxy. This allows the heat generated by the laser diode chip 28 upon generating an output laser beam 29 to be conducted away from the laser diode chip 28, effectively cooling down the laser diode chip 28, while allowing the floor plate 24 to be electrically isolated from the laser diode chip 28. The thermally conductive epoxy can be electrically non-conductive, although it is not required if the submount 28A itself is electrically non-conductive as explained above.

First 41 and second 42 wirebonds connect the first 21 and second 22 electrodes, respectively, to the laser diode chip 28, for supplying electric current to the laser diode chip 28 for generating the laser beam 29. The first 41 and second 42 wirebonds are disposed within the protective compartment space 36, for mechanical protection of the wirebonds 41 and 42. In the embodiment shown, the first wirebond 41 is electrically coupled to the laser diode chip 28 at its top surface, and the second wirebond 42 is electrically coupled to the submount 28A, which is in electrical contact with the bottom surface of the laser diode chip 28. In the embodiment when the submount 28A is made of a non-conductive material with the metal layer on top, the second wirebond 42 can be electrically coupled to the top metal layer. Parallel wirebonds can be used to reduce electrical resistance and inductance.

The laser diode chip 28 can also be mounted directly on the bottom plate 24, with the two electrodes for supplying electrical current provided on top of the laser diode chip 28. In this case, not shown, the first 41 and second 42 wirebonds are connected to the two electrodes on top of the laser diode chip 28.

Referring specifically to FIG. 2C, the laser diode chip 28 has front 37 and rear 38 facets, An optional dielectric coating 39 can be applied to the front 37 and rear 38 facets for environmental protection of the front 37 and rear 38 facets. Referring again to FIG. 2A, the front facet 37 of the laser diode chip 28 faces the fourth perimeter side 34 for outputting the laser beam 29.

Figure 3A:
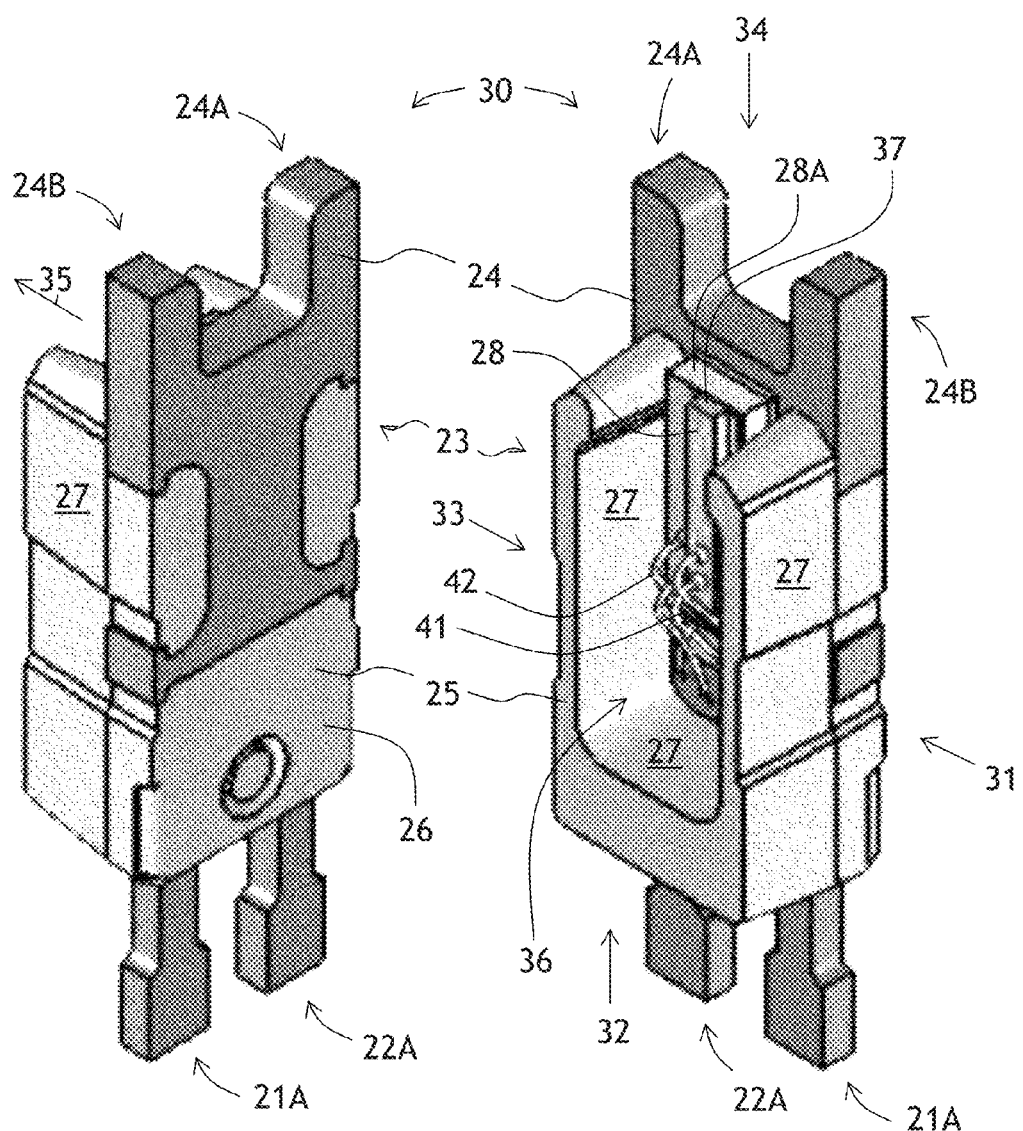
FIG. 3A is an isometric view of an embodiment of a packaged laser diode of the invention.
Figure 3B:
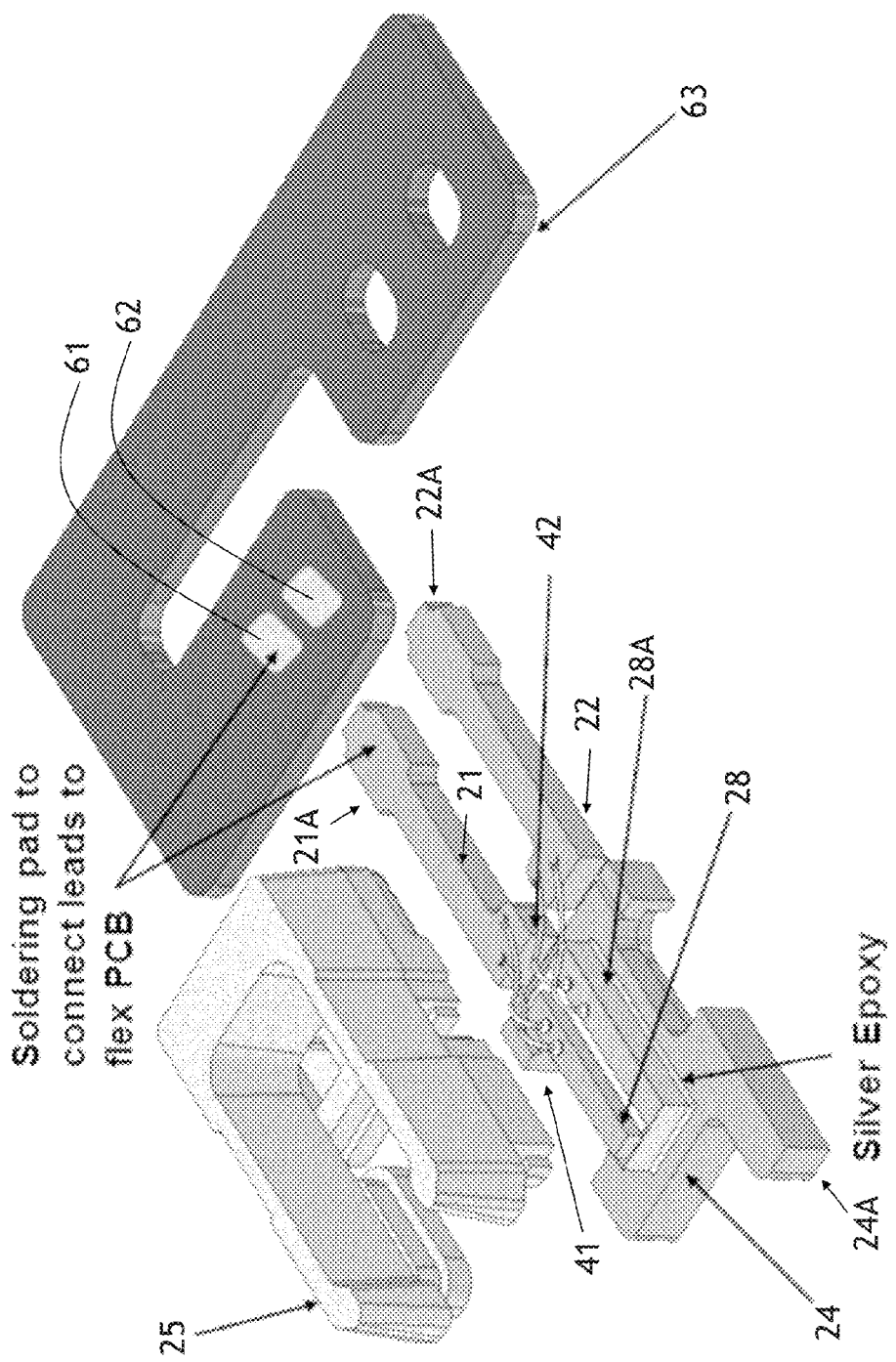
FIG. 3B is an exploded isometric view of the packaged laser diode of FIG. 3A, showing an optional flex-PCB.

Referring to FIG. 3A, a packaged laser diode 30 is an embodiment of the packaged laser diode 20 of FIGS. 2A and 2B. In the packaged laser diode 30 of FIG. 3A, the floor plate 24 includes a pair of mounting flanges 24A, 24B, for clamping the packaged laser diode 30 to an external mounting surface, not shown. The first and second electrodes 21 and 22 have flanges 21A and 22A, respectively, for soldering electrical wires, or for direct soldering to a printed circuit board (PCB). Turning to FIG. 3B, the plastic framework 25 is made out of molded LCP resin, which holds together the floor plate 24, the first electrode 21, and the second electrode 22. In FIG. 3B, the floor plate 24 has only one mounting flange 24A. Two first wirebonds 41 and two second wirebonds 42 are provided to lower the electrical resistance and increase reliability when supplying electric current to the laser diode chip 28. The wirebonds 41 and 42 can be made of 1.0 mil (25 micrometers) golden wire. A flex-PCB 63 can be soldered to the flanges 21A and 22A of the first 21 and second 22 electrodes, respectively, using soldering pads 61 and 62, respectively. Using flex-PCB 61 allows mounting of the packaged laser diode 30 at an arbitrary angle, to point the output laser beam 29 in a required direction.

The submount 28A can be mounted to the floor plate 24 using a thermally conductive epoxy, which establishes a good thermal contact between the submount 28A and the floor plate 24. The submount 28A is preferably electrically non-conductive, and/or the epoxy is electrically non-conductive, so that there is no electrical connection between the second electrode flange 22A and the floor plate 24. This allows one to provide a better EMI protection e.g. by connecting the floor plate 24 to the electrical ground thereby shielding the laser diode chip 28, while floating both the first 21 and second 22 electrodes with respect to the electrical ground. The floated first 21 and second 22 electrodes allow one to used floated wires running to the first 21 and second 22 electrodes (the wires are not shown in FIG. 3C). When the wires are floated, they can be EMI-protected by an external grounded EMI shield. As a result, the packaged laser diode 30 can be effectively EMI-shielded.

Figure 4A:
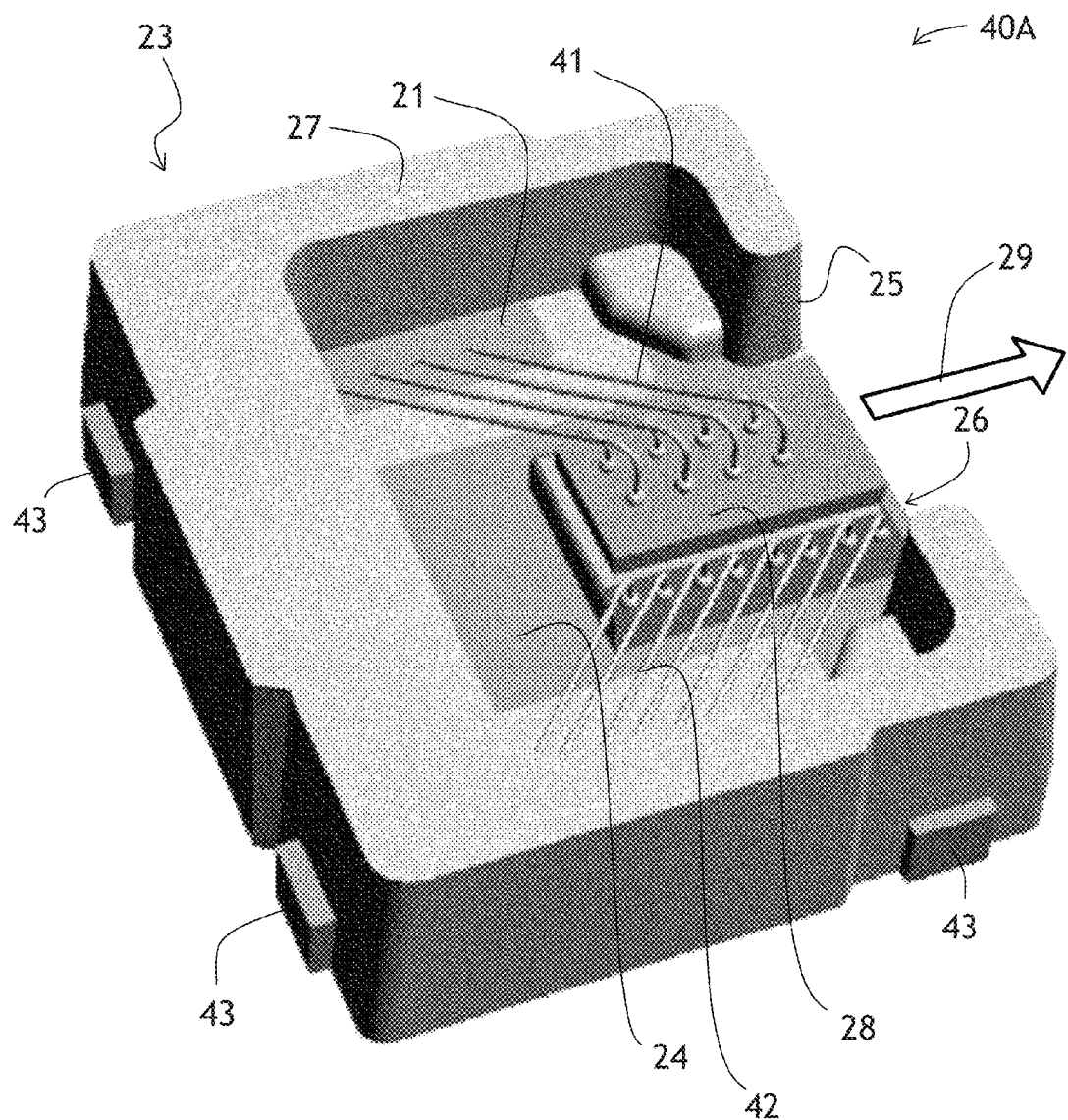
FIG. 4A is a three-dimensional view of an embodiment of a packaged laser diode of the invention, suitable for surface mounting to a printed circuit board.

Turning to FIGS. 4A and 4B, an embodiment 40A of the packaged laser diode 20 of FIGS. 2A and 2B is suitable for surface mounting to a PCB (not shown in FIG. 4A). To that end, the floor plate 24 and the first 21 and second 22 electrodes each extend through sidewall 27 (FIG. 4A) and/or through the bottom portion 26 (FIG. 4B), forming stubs 43 for surface-mounting to the PCB via soldering to a bottom and/or a side of the stubs 43. A plurality of first 41 and second 42 wirebonds are provided, for lower electrical resistance and inductance and better reliability when supplying electric current to the laser diode chip 28. Referring now to FIG. 4C, an embodiment 40C is similar to the embodiment 40A of FIG. 4A, only in the embodiment 40C of FIG. 4C, a turning mirror 44 is provided for directing the laser beam 29 away from the floor plate 24, e.g. in a direction perpendicular to the floor plate 24. The mirror 44 extends from the fourth perimeter side 34 of the bottom portion 26 at an acute angle with respect to the laser diode chip 28.

Figure 5A:
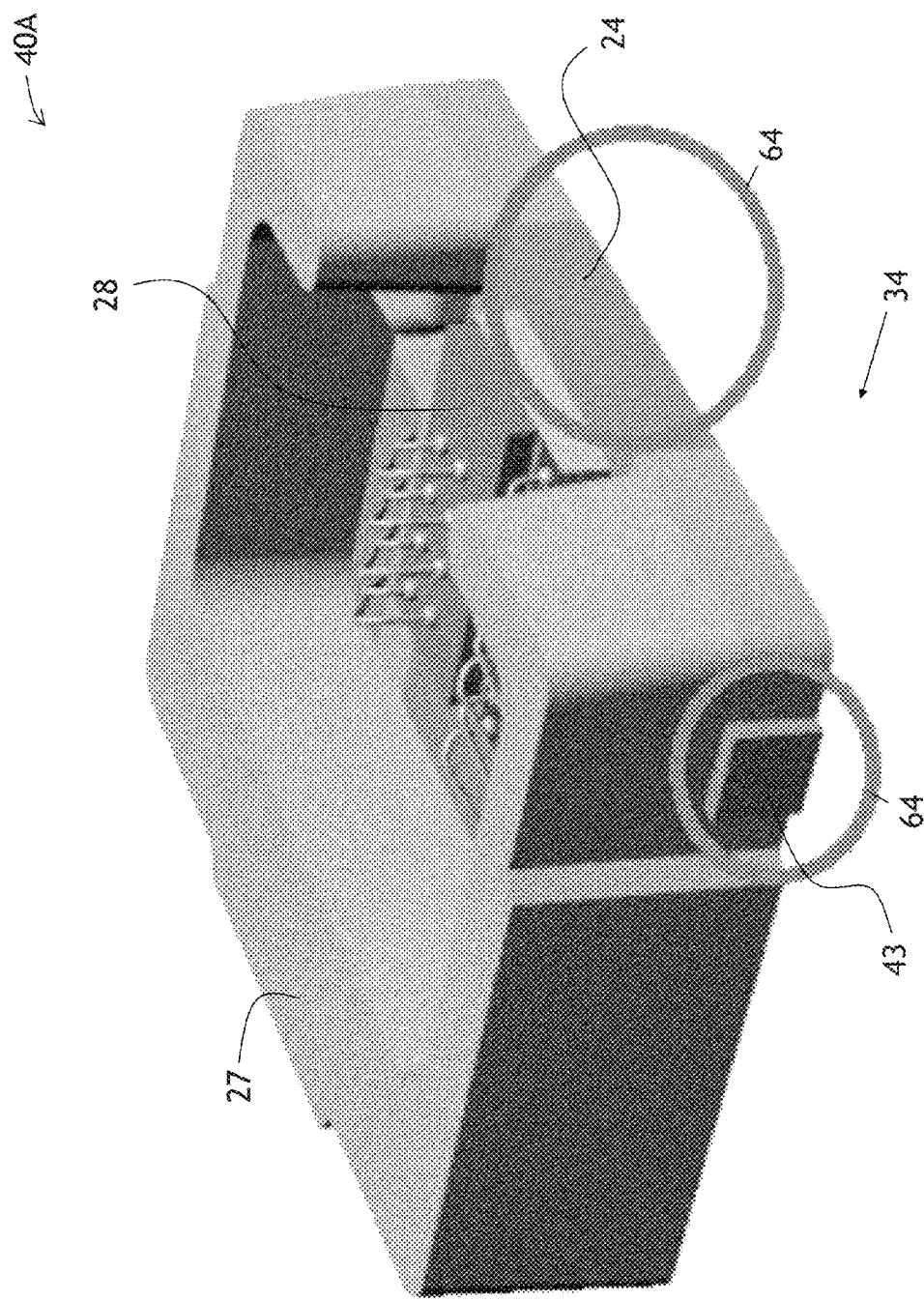
FIG. 5A is a three-dimensional view of the packaged laser diode of FIG. 4A, showing locations for connecting a conductive, EMI-protective cover (the cover not shown)

Referring to FIGS. 5A and 5B, the EMI resistance of the packaged laser diodes 20, 30, 40A, and 40C can be further improved by providing a cover 45 (FIG. 5B). In FIG. 5A, mounting areas 64 denote locations where the cover 45 can be electrically connected to the floor plate 24. In FIG. 5B, the cover 45 is shown electrically connected to the stubs 43 of the floor plate 24. The cover 45 can remain electrically isolated from the floor plate 24; however, the cover 45 must be electrically decoupled from the electrodes 21 and 22 for proper EMI protection of the laser diode chip 28.

Referring to FIGS. 6A and 7A, a packaged laser diode 60A is shown surface-mounted to a PCB 48 with a solder wall 65 in horizontal and vertical positions, respectively. The packaged laser diode 60A is similar to the packaged laser diode 40A of FIG. 4A, with a difference that the packaged laser diode 60A of FIG. 6A includes a cover 45A (corresponding to the cover 45 in FIG. 5B) supported by the sidewall 27 and extending over the floor plate 24. The cover 45A is preferably conductive for better EMI shielding of the laser diode chip 28. It is further preferable that the cover 45A be electrically coupled to the floor plate 24 for EMI shielding of the laser diode chip 28. The electrical and/or mechanical connection can be made at the aforementioned locations 64 shown in FIG. 5. An aperture 66 can be provided in the cover 45A for the laser beam 29 to exit the packaged laser diode 60A. The cover 45A can also include an optical element 47 extending over the aperture 66, such as a lens, a diffuser, a grating, etc., for coupling to the exiting laser beam 29.

Referring now to FIGS. 6B and 7B, a packaged laser diode 60B is similar to the packaged laser diode 60A of FIGS. 6A and 7A, with a difference that the packaged laser diode 60B of FIG. 6B includes the turning mirror 44 and, accordingly, the position of the aperture 66 on a cover 45B (corresponding to the cover 45 in FIG. 5B) is not on a side but on the top of the cover 45B.

Due to the leadframe configuration of the packaged laser diodes 20, 30, 40A, 40C, 60A, and 60B of FIGS. 2A-2B, 3A-3B, 4A-4B, 6A-7A and 6B-7B, respectively, the size of the packaged laser diodes 20, 30, 40A, 40C, 60A, and 60B can be smaller than the size of the TO can-packaged laser diodes 10 of the prior art (FIG. 1). Preferably, the plastic framework 25 of the packaged laser diodes 20, 30, 40A, 40C, 60A, and 60B has a length and a width not exceeding 5.0 mm, and a height not exceeding 2.0 mm.

Figure 8:
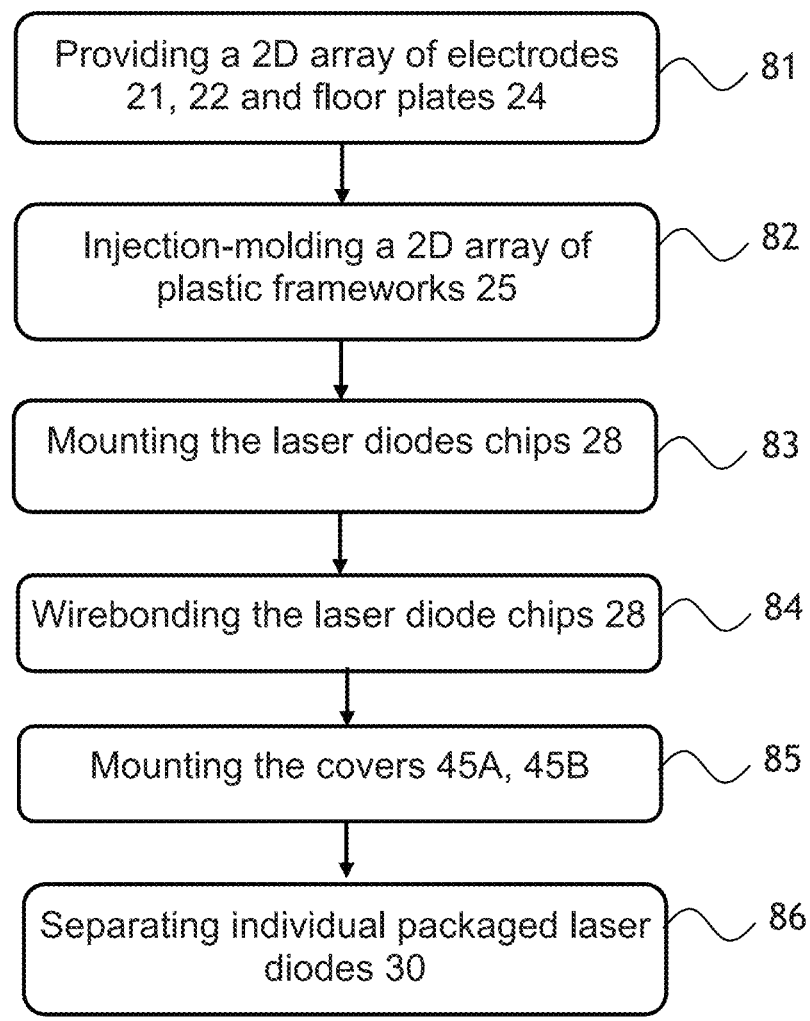
FIG. 8 is a flow chart of a method of manufacturing laser diodes of the invention.
Figure 9:
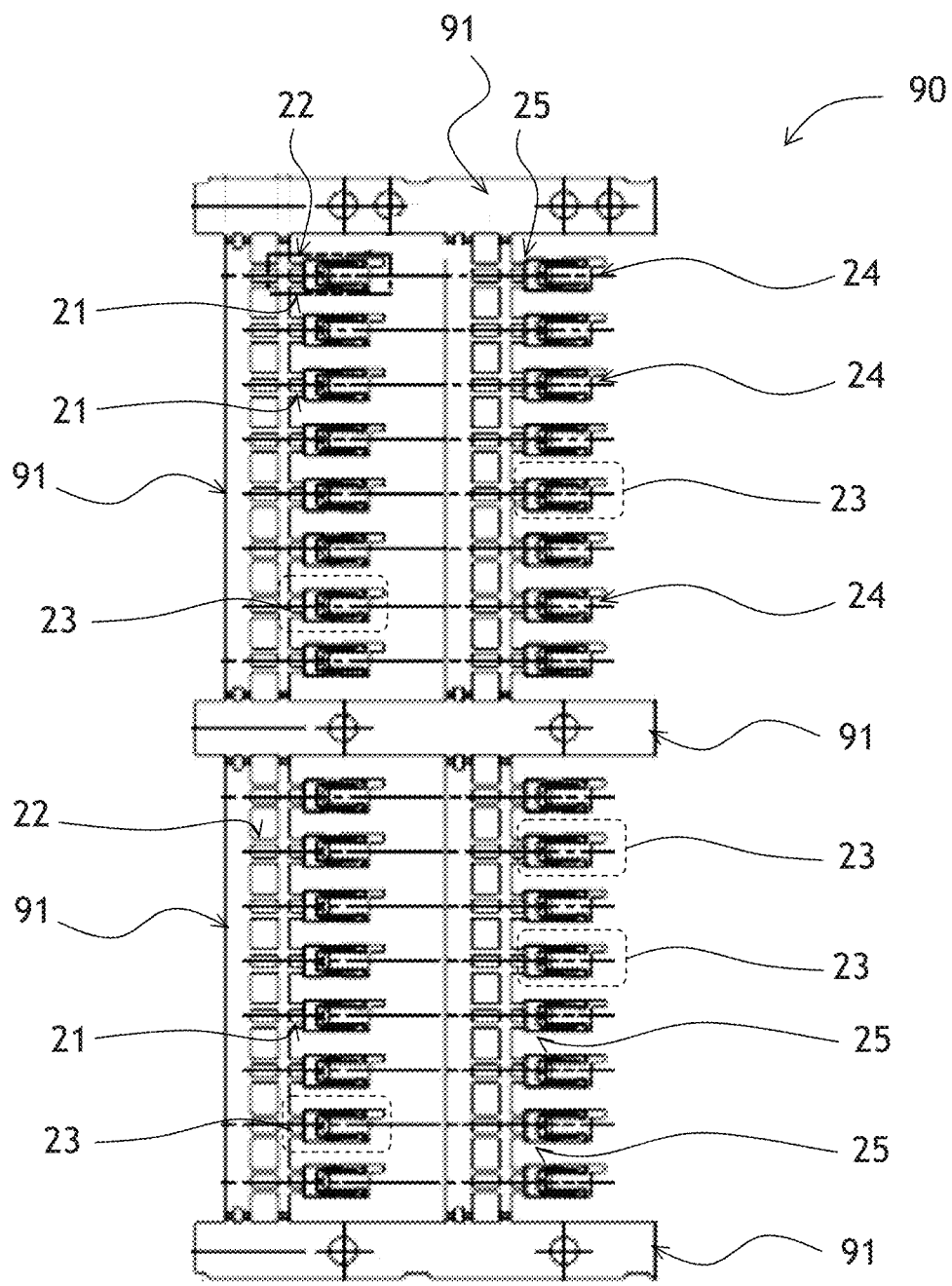
FIG. 9 is a plan view of a 2D array of leadframes used in manufacturing of the laser diodes of FIG. 3A according to the method of FIG. 8.

Another advantage of the packaged laser diodes 20, 30, 40A, 40C, 60A, and 60B is that the packaging can be done not on individual devices but on one-dimensional (1D) and two-dimensional (2D) arrays of devices. Referring to FIGS. 8 and 9 with further reference to FIG. 3A, an exemplary method 80 (FIG. 8) of manufacturing the packaged laser diode 30 of FIG. 3A includes a step 81 of providing a 2D array of the floor plates 24, first electrodes 21, and second electrodes 22 interconnected by frame bars 91 (FIG. 9). Then, in a step 82, a two-dimensional array of plastic frameworks 25 is injection molded over the two-dimensional array of the previous step 81, to obtain a two-dimensional array 90 of the interconnected leadframes 23 (highlighted by dashed rectangles) each comprising one of the floor plates 24, first electrodes 21, and second electrodes 22. The plastic frameworks 25 will support the corresponding floor plates 24, the first electrodes 21, and the second electrodes 22 upon separation into individual devices. The plastic frameworks 25 also electrically will insulate the corresponding floor plates 24, the first electrodes 21, and the second electrode 22 from each other, upon separation. The plastic frameworks 25 include the corresponding bottom portions 26 (FIG. 3A) having the floor plates 24; the bottom portion have the first 31 to fourth 34 perimeter sides and the sidewalls 27 extending from the bottom portions 26 on at least the first 31 to third 33 perimeter sides in the direction 35 substantially perpendicular to the floor plates 24, thereby defining the protective compartment spaces 36 with the floor plates 24 at the bottom. The plastic frameworks 25 are preferably injection molded out of a liquid crystal polymer material, which can tolerate high processing temperatures required for mounting the laser diode chips 28.

In a following step 83, the laser diode chips 28 are mounted on the floor plates 24, so that the laser diode chips 28 are at least partially disposed within the corresponding protective compartment spaces 36. The front facets 37 of the laser diodes chips 28 face the fourth perimeter side 34. Then, in a following step 84, the laser diode chips 28 are wirebonded by connecting the first 21 and second 22 electrodes to the laser diode chip 28 with the first 41 and second 42 wirebonds, respectively. Then, in an optional step 85, electrically conductive covers e.g. the covers 45A and 45B of FIGS. 6A and 6B, respectively, are connected to the sidewalls 27; the covers 45A/45B can also be electrically coupled to the floor plates 24 for a better electromagnetic shielding of the laser diode chips 28. Then, individual packaged laser diodes 30 are separated from the array 90 in a step 86.

Although the above described batch-type processing according to the method 80 of FIG. 8 is preferable, the packaged laser diodes 20, 30, 40A, 40C, 60A, and 60B of FIGS. 2A-2B, 3A-3B, 4A-4B, 6A-7A and 6B-7B, respectively, can also be made individually if so desired. The leadframes 23 can be provided individually, and the laser diode chips 28 can be mounted and wirebonded individually as well. Individual covers 45A/45B can also be provided accordingly.

The laser diode chip 28 can be mounted in the mounting step 83 by mounting the laser diode chip 28 to the respective submount 28A, and then mounting the submount 28A on the floor plate 24. For embodiments where the submount 28A includes an electrically non-conductive material coated with a metal layer on top, the mounting step 83 includes soldering the laser diode chip 28 to the metal layer; and the wirebonding step 84 includes electrically coupling the first wirebond 41 to the laser diode chip 28, and electrically coupling the second wirebond 42 to the metal layer. When the submount 28A is electrically conductive, the mounting step 83 can be done by epoxying the submount 28A to the floor plate 24 with a thermally conductive, electrically non-conductive epoxy. In this case, the first wirebond 41 can be electrically coupled to the laser diode chip 28, and the second wirebond 42 can be electrically coupled to the conductive submount 28A. The covers 45, 45A, and/or 45B can be electrically coupled to the floor plate 24.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A packaged laser diode comprising:
   a leadframe comprising a thermally and electrically conductive floor plate, first and second electrodes, and a plastic framework supporting therein the floor plate, the first electrode, and the second electrode, wherein the plastic framework electrically insulates the floor plate, the first electrode, and the second electrode from each other;
   the plastic framework including a bottom portion having therein or thereon the floor plate, the bottom portion having first to fourth perimeter sides and a sidewall extending from the bottom portion on at least the first to third perimeter sides in a direction substantially perpendicular to the floor plate, thereby defining a protective compartment space with the floor plate at the bottom;
   a laser diode chip mounted on the floor plate and at least partially disposed within the protective compartment space, the laser diode chip having front and rear facets, the front facet facing the fourth perimeter side for outputting a laser beam generated by the laser diode chip, wherein in operation, the floor plate supports and conducts away heat generated by the laser diode chip; and
   first and second wirebonds connecting the first and second electrodes, respectively, to the laser diode chip, for supplying electric current thereto for generating the laser beam, wherein the first and second wirebonds are disposed within the protective compartment space.

2. The packaged laser diode of claim 1, further comprising a submount mounted on the floor plate, wherein the laser diode chip is mounted to the submount.

3. The packaged laser diode of claim 2, wherein the submount comprises an electrically non-conductive material coated with a metal layer on top, wherein the laser diode chip is soldered to the metal layer, wherein the first wirebond is electrically coupled to the laser diode chip, and the second wirebond is electrically coupled to the metal layer.

4. The packaged laser diode of claim 2, further comprising a thermally conductive, electrically non-conductive epoxy layer between the submount and the floor plate, wherein the first wirebond is electrically coupled to the laser diode chip, and the second wirebond is electrically coupled to the submount.

5. The packaged laser diode of claim 1, further comprising an electrically conductive cover supported by the sidewall and extending over the floor plate and electrically isolated from the first and second electrodes.

6. The package laser diode of claim 5, wherein the cover is electrically coupled to the floor plate for electromagnetic shielding of the laser diode chip.

7. The packaged laser diode of claim 1, wherein the floor plate and the first and second electrodes each extend through the bottom portion or through the sidewall, forming stubs for surface-mounting to a printed circuit board via soldering to the stubs.

8. The packaged laser diode of claim 1, wherein the laser diode chip has a dielectric coating on the front and rear facets for environmental protection thereof.

9. The packaged laser diode of claim 1, further comprising a cover supported by the sidewall and extending over the floor plate, wherein the cover has an aperture for the laser beam to exit the packaged laser diode, and an optical element extending over the aperture, for coupling to the exiting laser beam.

10. The packaged laser diode of claim 1, further comprising a mirror extending from the fourth perimeter side of the bottom portion at an acute angle with respect to the laser diode chip, for directing the laser beam away from the floor plate.

11. The packaged laser diode of claim 1, wherein the plastic framework comprises a liquid crystal polymer.

12. The packaged laser diode of claim 11, wherein the plastic framework has a length and a width not exceeding 5.0 mm, and a height not exceeding 2.0 mm.

13. A method for packaging a laser diode, the method comprising:
 (a) providing a leadframe comprising a thermally and electrically conductive floor plate, first and second electrodes, and a plastic framework having therein the floor plate, the first electrode, and the second electrode;
 the plastic framework including a bottom portion having therein or thereon the floor plate, the bottom portion having first to fourth perimeter sides and a sidewall extending from the bottom portion on at least the first to third perimeter sides in a direction substantially perpendicular to the floor plate, thereby defining a protective compartment space with the floor plate at the bottom;
 (b) upon completing step (a), mounting a laser diode chip on the floor plate so that the laser diode chip is at least partially disposed within the protective compartment space, the laser diode chip having front and rear facets, the front facet facing the fourth perimeter side for outputting a laser beam generated by the laser diode chip; and
 (c) upon completing step (b), wirebonding the laser diode chip by connecting the first and second electrodes to the laser diode chip with first and second wirebonds, respectively, for supplying electric current thereto for generating the laser beam, wherein the first and second wirebonds are disposed within the protective compartment space.

14. The method of claim 13, wherein step (b) includes
 (b1) mounting the laser diode chip to a submount; and
 (b2) mounting the submount on the floor plate.

15. The method of claim 14, wherein the submount comprises an electrically non-conductive material coated with a metal layer on top, wherein step (b1) includes soldering the laser diode chip to the metal layer; and step (c) includes electrically coupling the first wirebond to the laser diode chip, and electrically coupling the second wirebond to the metal layer.

16. The method of claim 14, wherein step (b2) includes epoxying the submount to the floor plate with a thermally conductive, electrically non-conductive epoxy; and wherein step (c) includes electrically coupling the first wirebond to the laser diode chip, and electrically coupling the second wirebond to the submount.

17. The method of claim 13, further comprising
 (d) upon completing step (c), connecting to the sidewall an electrically conductive cover extending over the floor plate.

18. The method of claim 17, further comprising
 (e) electrically coupling the cover to the floor plate for electromagnetic shielding of the laser diode chip.

19. The method of claim 13, wherein step (a) includes
 (I) providing a two-dimensional array of interconnected floor plates, first electrodes, and second electrodes;
 (II) injection molding a two-dimensional array of plastic frameworks over the two-dimensional array of step (I), so as to obtain a two-dimensional array of interconnected leadframes each comprising one of the floor plates, first electrodes, and second electrodes of step (I);
 wherein step (b) is performed for each one of the interconnected leadframes of step (II), and wherein step (c) is performed for each one of the interconnected leadframes of step (II), so as to obtain a two-dimensional array of packaged laser diodes;
 the method further comprising
 (i) upon completing step (c), separating individual packaged laser diodes from the array of packaged laser diodes.

20. The method of claim 19, wherein step (II) includes injection molding the two-dimensional array of plastic frameworks out of a liquid crystal polymer material.

* * * * *